United States Patent
Burghardt et al.

[11] Patent Number: 5,414,559
[45] Date of Patent: May 9, 1995

[54] DEVICE FOR HOMOGENIZING A LIGHT BEAM

[75] Inventors: Berthold Burghardt, Waake; Hans-Jürgen Kahlert, Göttingen; Uwe Sarbach, Jena, all of Germany

[73] Assignee: Microlas Lasersystem GmbH, Gottingen, Germany

[21] Appl. No.: 81,018

[22] Filed: Jun. 22, 1993

[30] Foreign Application Priority Data

Jun. 24, 1992 [DE] Germany .................. 42 20 705.3

[51] Int. Cl.⁶ .............................................. G02B 27/12
[52] U.S. Cl. ...................................... 359/623; 359/619; 359/599; 362/268
[58] Field of Search ............. 359/623, 622, 621, 620, 359/619, 599; 362/268, 259

[56] References Cited

U.S. PATENT DOCUMENTS

| | | | |
|---|---|---|---|
| 3,670,260 | 6/1972 | Koester et al. ................. | 359/623 |
| 4,867,514 | 9/1989 | Waldron ......................... | 359/619 |
| 5,098,184 | 3/1992 | van den Brandt et al. ..... | 359/622 |
| 5,237,367 | 8/1993 | Kudo .............................. | 362/268 |
| 5,270,859 | 12/1993 | Wirth ............................. | 359/622 |

Primary Examiner—Jon W. Henry
Attorney, Agent, or Firm—Brumbaugh, Graves, Donohue & Raymond

[57] ABSTRACT

An optical device for homogenizing a light beam comprises a plurality of first lenses on which the light beam impinges from one side. At the side on which the light beam impinges the first lenses are convex, while they are prismatic at the opposite side at which the light beam emerges from the lenses. At least one convergent lens is disposed downstream of the lenses mentioned in the direction of the light beam. Instead of giving the first lenses a prismatic configuration it is also possible to make the first lenses plano-convex and arrange second lenses of plano-concave shape downstream of the first lenses in the direction of the light beam.

3 Claims, 5 Drawing Sheets

DEVICE FOR HOMOGENIZING A LIGHT BEAM

FIELD OF THE INVENTION

The instant invention relates to a device for homogenizing a light beam, especially a beam of laser light.

In the present context the term "light" is to be understood in the broad sense as comprising electromagnetic radiation, in other words specifically including invisible wavelengths of the electromagnetic spectrum, especially ultraviolet radiation, such as generated by an excimer laser.

BACKGROUND OF THE INVENTION

Laser beams often do not have a uniform distribution of intensity throughout their cross section. This is true of a great many laser sources. The intensity distribution of many laser beams is described, for instance, by a bell shaped curve (Gaussian profile) which is rotationally symmetrical to the direction of spread of the beam. In the case of the so-called unstable resonators the intensity of the laser beam often is characterized by a hole in the middle of the beam cross section. Intensity peaks, so-called hot spots, frequently occur both with pulsed and continuous laser sources. These are limited areas in the beam cross section where the intensity of the laser beam is much greater than in the remainder of the area. Such hot spots either can appear at certain locations or they may jump within the cross section of the beam.

This irregular distribution of the beam intensity throughout the beam cross section and solid angle is disadvantageous for a variety of applications of laser beams. Irregular intensity distributions or intensity peaks and inhomogeneous or unsymmetrical angular energy distributions can be disturbing, for instance, when pieces of large area are to be illuminated or processed with the help of laser beams.

It is true that disturbing intensity peaks do not occur with transverse gas discharge lasers, such as TEA-$CO_2$ lasers or excimer lasers, yet they must be manipulated optically to illuminate a piece which has a large surface area, and this means having to put up with considerable losses in intensity. Frequently also an adaptation of the angular energy distribution is required.

Known methods of homogenizing the distribution of intensity in laser beams are expensive and/or not applicable in all wavelength sections.

DE 38 29 728 A1 specifies a device for homogenizing the intensity distribution in the cross section of a laser beam with which optical elements, each accommodating part of the cross section of the laser beam, are disposed in said laser beam to mutually superimpose their respective partial beams. That is accomplished by so-called cylinder lens rods.

DE 38 41 045 A1 describes an arrangement for homogenizing the intensity distribution in the cross section of a laser beam, comprising a prism which is arranged in the resonator.

In the specification below, the prior art cited above will be assumed to be known.

Another difficulty sometimes encountered in laser applications is the fact that two partial beams must be provided which are separated in space and have the same angular energy distribution, each partial beam serving to illuminate an area of its own.

SUMMARY OF THE INVENTION

The invention thus is based on the technical problem of providing a device for homogenizing a light beam.

That problem is solved, in accordance with the invention, by a device for homogenizing a light beam, comprising a plurality of first lenses impinged upon by the light beam from one side, the first lenses each being convex at the side on which the light beam impinges and being prismatic at the side at which the light beam emerges, and further comprising at least one convergent lens disposed downstream of the plurality of first lenses in the direction of the light beam.

This device according to the invention not only results in homogenization of the light beam it also creates two partial beams which are separated in space and each have the same homogeneous angular energy distribution. The two partial beams thus may be used to illuminate two separate regions.

With this embodiment of the invention three different effects are realized at the same time: first, the light beam (laser beam) is homogenized, secondly, the light beam is divided into two different partial beams, each having a homogeneous intensity distribution, and thirdly, both partial beams have similar angular energy distributions (numerical illumination apertures).

According to another variant of the invention the above mentioned problem of homogenizing a light beam is solved by a plurality of first lenses impinged upon by the light beam from one side and each being convexly shaped at this side, and a plurality of second lenses disposed downstream of the plurality of first lenses in the direction of the light beam and each being concavely shaped at the side at which the light beam emerges from them, and further at least one convergent lens disposed downstream of the plurality of second lenses in the direction of the light beam.

This last mentioned embodiment of the device according to the invention not only homogenizes the intensity distribution in a laser beam but also has the further advantage of providing an especially small illumination aperture with a small illumination field size. This means that with this device according to the invention the light beam (e.g. a laser beam) can be introduced into a downstream optical means with a relatively small angle of marginal rays (based on the optical axis of the system).

A device according to the invention is used with preference to homogenize and, if desired, also to split an excimer laser beam.

According to a preferred modification of the invention the lenses each are of rod shape and their longitudinal axes extend parallel to each other.

The convex configuration of the lenses preferably is cylindrical. This embodiment of the invention, therefore, comprises a plurality of cylindrical lens prism rods.

BRIEF DESCRIPTION OF THE DRAWING

The invention will be described further, by way of example, with reference to the accompanying drawings, in which.

DESCRIPTION OF THE PREFERRED EMBODIMENTS

Figure 1A:
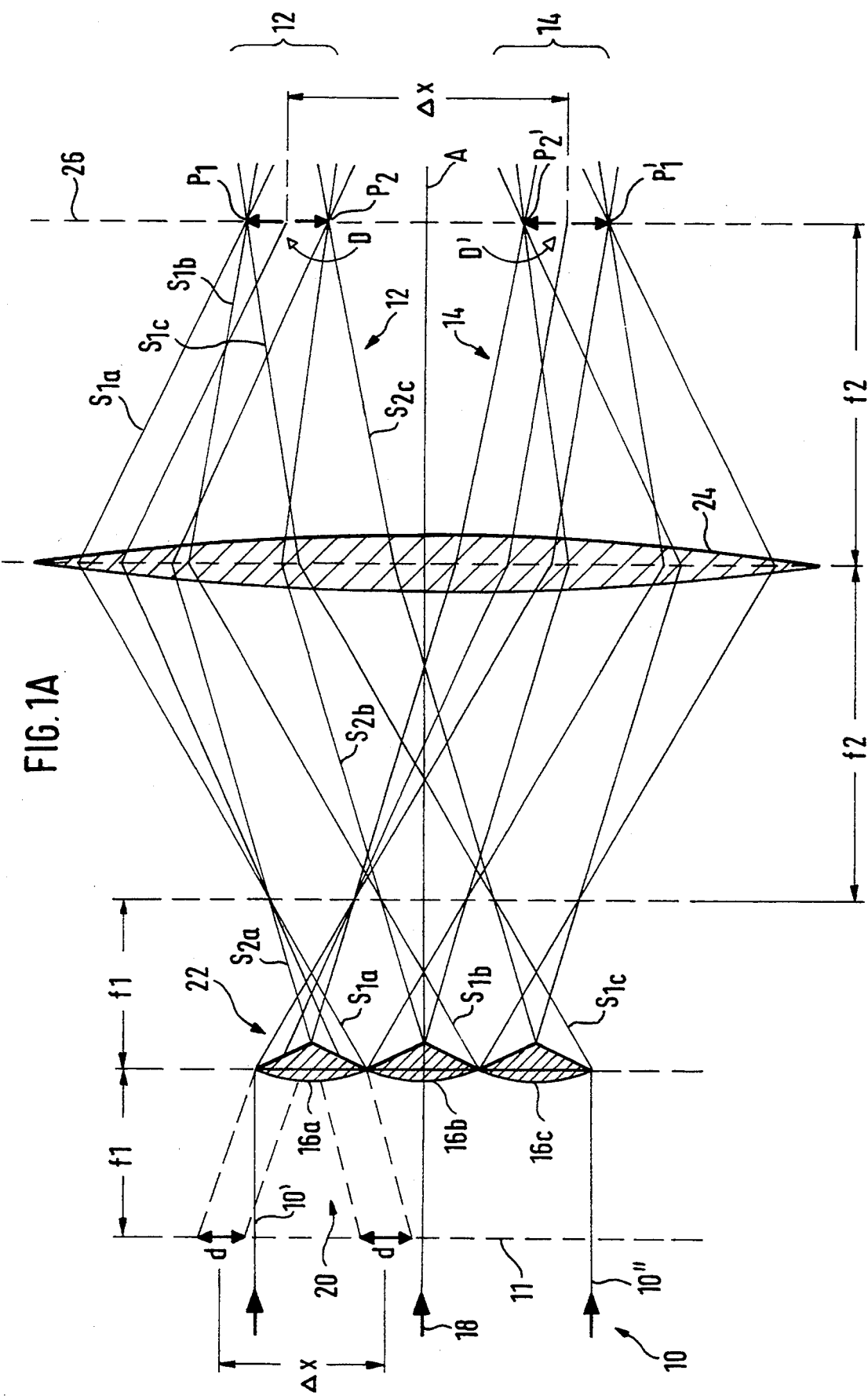
FIGS. 1a, 1b are diagrammatic presentations of an homogenizing optical system according to the invention, including beam paths of particular interest.

The optical device illustrated in FIG. 1a is intended to be used for homogeneous illumination of two separate regions, namely regions D and D' shown at the right in FIG. 1a on a screen 26.

This will be explained with reference to a light beam 10 coming from an excimer laser in the case of the embodiment shown here.

The marginal rays of the light beam 10 are marked 10' and 10''. Beam 10 is to be split into two partial beams 12 and 14.

Figure 1B:
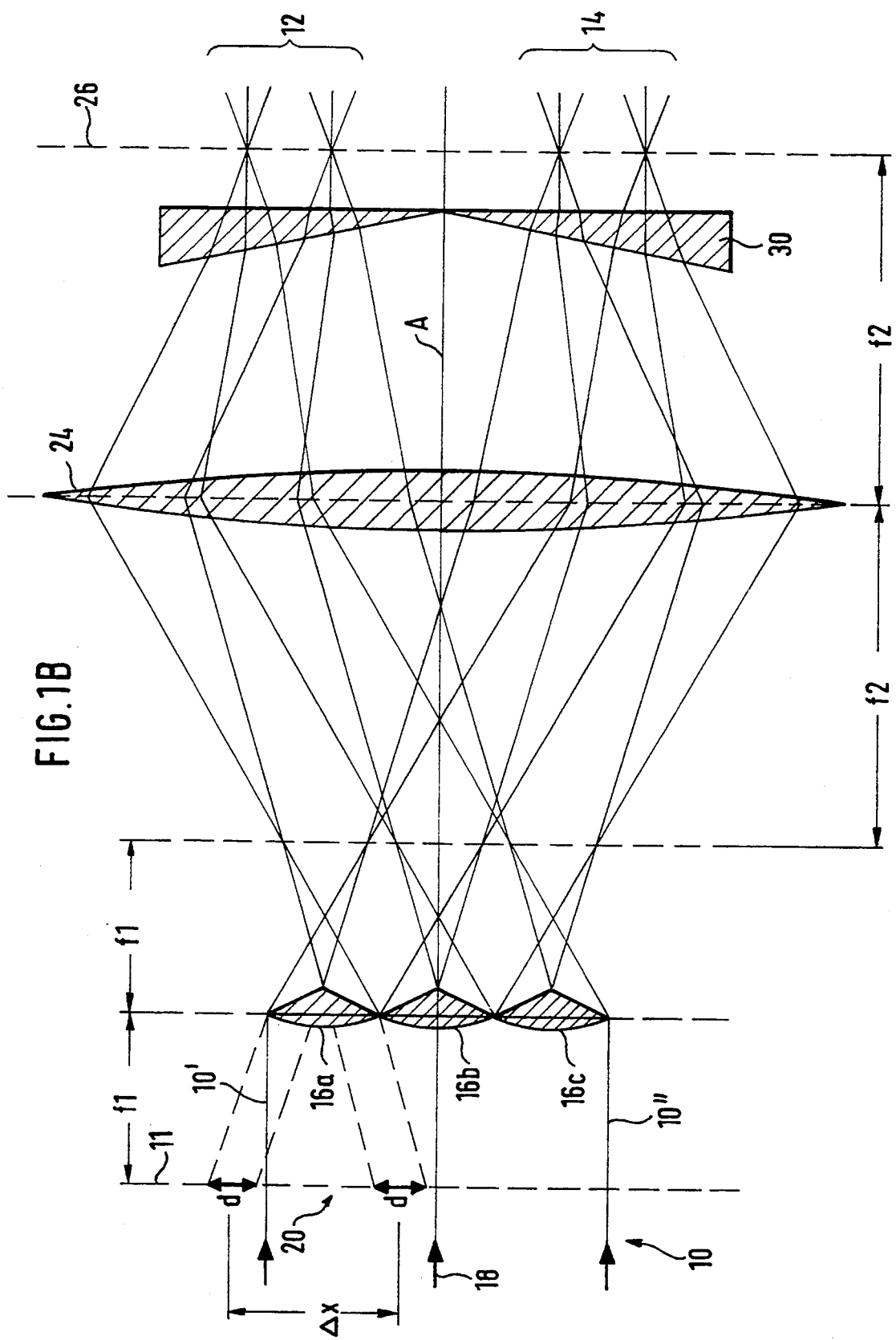

In the embodiment according to FIGS. 1a and 1b this is accomplished by means of three lenses 16a, 16b, and 16c.

The light beam 10 impinges on the lenses 16a, 16b, 16c in the direction of arrow 18. The side 20 at which the light impinges on the lenses thus is situated on the left in FIG. 1a. Characteristic beam paths are shown at the side of emergence 22 from the lenses 16a, 16b, and 16c, respectively. The lenses are shown hatched to distinguish them from the rays.

As may be gathered from FIGS. 1a, 1b, each of the lenses 16a, 16b, 16c is a combination of a cylindrical lens with a prism arranged in such a way that, in a cross sectional plane parallel to the direction 18 in which the light beam 10 spreads, each lens has a portion at the incident side 20 which corresponds to a cylindrical lens, while its emergent side 22 is shaped like a prism, i.e. has a triangular cross section, with the tip of the triangle oriented in the direction 18 of incidence of the light beam 10.

The optical axis of the system is designated A.

A double convex convergent lens 24 having focal length f(2) is mounted downstream of the lenses 16a, 16b, and 16c in the direction 18 of the light beam 10.

The convergent lens 24 images the light rays deflected by the plurality of lenses 16a, 16b, 16c on the screen 26 in such manner that two regions D, D' are illuminated on the screen surface. The upper region D is illuminated by partial beam 12, while the lower region D' is illuminated by partial beam 14.

The illuminated region D is limited by points $P_1$ and $P_2$ and region D' is limited by points $P'_1$ and $P'_2$ (partial beam 14). A space of which the diameter corresponds to the distance between points $P_2$-$P'_2$ and which is symmetrical with respect to the optical axis A is left free of light rays. This means that the partial beams 12 and 14 are separated in space.

The beam path is illustrated diagrammatically in FIG. 1. For instance, point $P_1$ is formed on the screen 26 by the convergent lens 24 focussing three marginal rays $S_{1a}$, $S_{1b}$, and $S_{1c}$, each of which is refracted at the respective lower edge of the cylindrical/prismatic lenses 16a, 16b, 16c, in the manner shown.

Point $P_2$ is illuminated by focussing of rays $S_{2a}$, $S_{2b}$, $S_{2c}$, each formed approximately in the middle of the prisms, as may be seen in FIGS. 1a, 1b.

Points $P'_1$ and $P'_2$ at the margins of illumination of region D' result in analogous manner from the rays shown in the drawing.

It may be gathered from the beam path illustrated and specified above that not only is the light beam 10 split into two partial beams 12 and 14, but also that the partial beams 12 and 14 are homogenized by the superpositioning of partial beams. The term "homogenization" thus means that the illuminated regions D and D' are illuminated uniformly so that any variations in intensity across the surface area are largely compensated.

The lens system specified provides an image of plane 11 with virtual light segment fields d in plane 26. The virtual light segment fields are defined by the prisms of the lenses 16a, 16b, 16c, as is the distance x between the individual fields. The image of this plane 11 is created in plane 26, in correspondence with the ratio of the focal lengths, either enlarged or reduced, according to the equations below:

$$D = d \cdot \frac{f(2)}{f(1)}, \quad X = x \cdot \frac{f(2)}{f(1)}$$

Each partial segment d corresponds to a partial beam and is superimposed in the image plane 26. In this manner homogenization is achieved. The greater the number of partial beams that are generated and superposed, the more uniform the illumination of regions D and D' becomes, in correspondence with the number of lenses and prismatic members. The meaning of the symbols follows from FIGS. 1a, 1b.

The partial beams (e.g. edges $S_{1c}$ and $S_{2c}$) originate from a virtual light source either at infinity or at finity, depending on the arrangement of the lenses. FIG. 1b shows how the ray tilt caused by prisms 16a, b, c in the plane of the prisms can be changed or compensated to 0°. That is especially important for the further processing of the light beam in an imaging lens. It plays a particularly important role when applied in ablation. Ray tilt and angular energy distribution at the various points of regions D and D' is especially significant in ablation usage as regards the geometry of the microstructure to be created.

Figure 2:
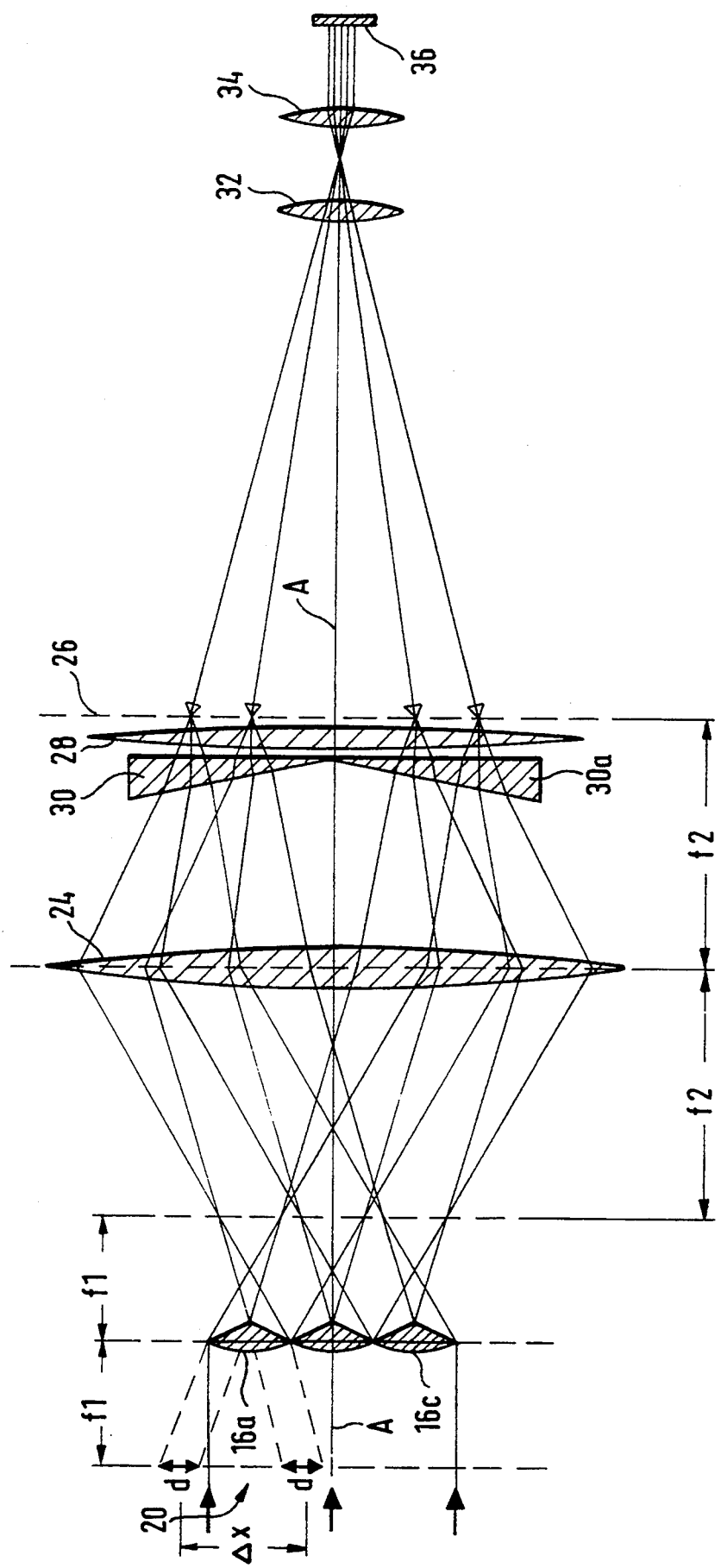
FIG. 2 shows the incorporation of an homogenizing illuminating optical system according to FIG. 1b in an imaging system.

As conmpared to the embodiment of FIG. 1b, FIG. 2 shows additional optical elements, namely convergent lenses 28, 32, and 34 as well as two prisms 30, 30a for further processing and imaging of the homogenized partial beams 12 and 14 obtained in the manner specified above. The prisms 30, 30a function to correct or adjust the ray tilt. Apart from the field size of the object and the numerical aperture of the illumination, the ray tilt must be adjusted such that the light will get into the imaging system 32, 34. A symmetrical angular energy distribution is important to produce symmetrical ablation patterns. Thus the prisms 30, 30a are an essential additional optical element in FIG. 2 (as compared to FIGS. 1a, 1b). They serve to orient the main direction of the homogenized partial beams 12 and 14 parallel to the optical axis A of the system. This affords a relatively small numerical aperture for further imaging of the homogenized partial beams 12 and 14 by an imaging optical system (lenses 32, 34).

The embodiments described above can be modified. For instance, the three cylindrical/prismatic lenses 16a, 16b, 16c shown may be replaced by a plurality of such lenses. In that event the lenses each are shaped like a rod, and the longitudinal axes of the rods extend perpendicularly with respect to the plane of the drawing of FIGS. 1 and 2. That permits simple dividing and homogenizing of the beams, especially of excimer lasers, which are differently inhomogeneous in the two directions. Moreover, spherical lenses of square or rectangular cross section can be used instead of cylindrical lenses.

Systems analogous to the arrangements shown may be used to split light beams into more than two partial beams, e.g. into four partial beams.

Figure 3:
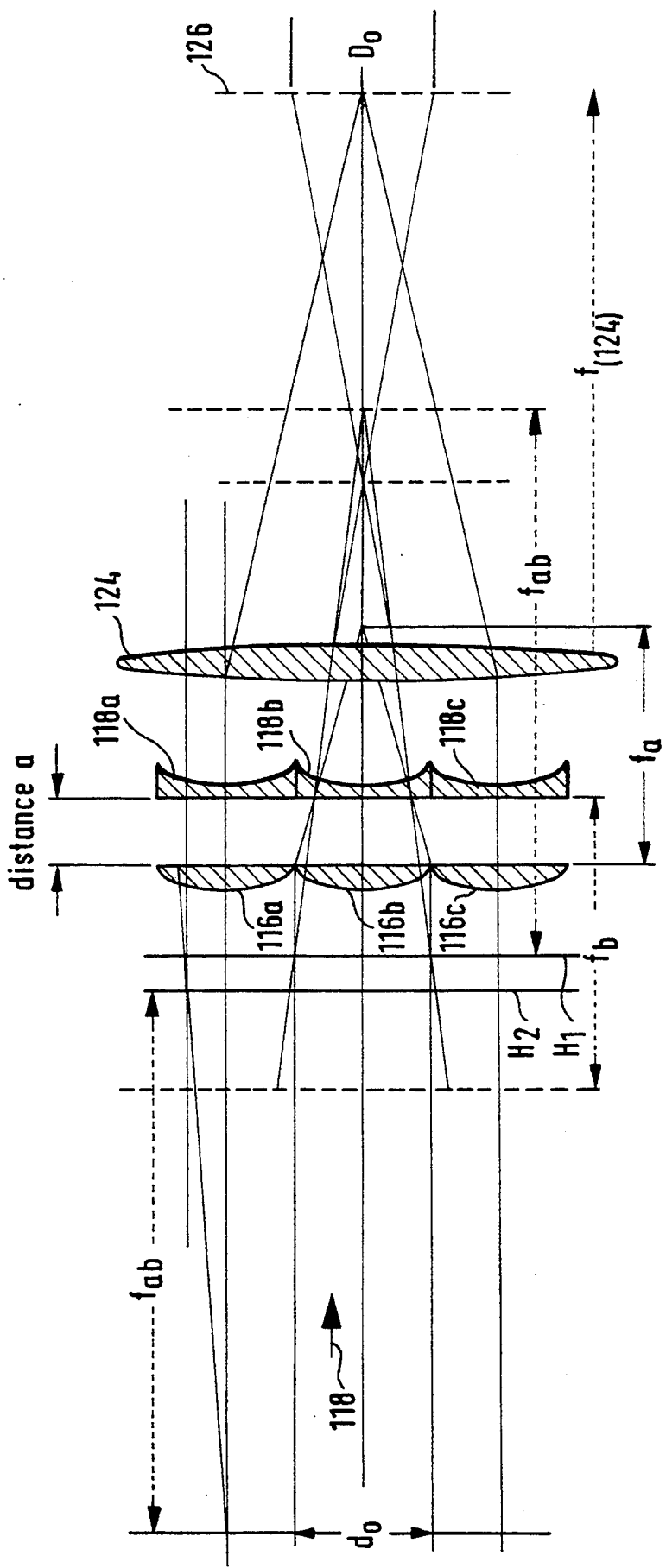
FIG. 3 shows another embodiment of an optical system according to the invention for homogenizing a laser beam.

FIG. 3 shows another embodiment of an optical device for homogenizing the intensity distribution of a laser beam. This embodiment not only brings about homogenization of the beam but also provides an especially small illumination aperture.

Optical systems for beam homogenization at illumination apertures of above 0.03 are known in the art. However, highly reducing imaging optical systems require illumination apertures of extremely small value, namely values below 0.03 for the numerical aperture NA.

Limitations are imposed on the use of cylindrical lenses when a particularly small illumination aperture is to be realized and homogenization to be achieved at the same time. These limitations result from the fact that it is difficult to produce cylindrical lenses having a base width (d) smaller than typically 3 mm. At smaller base widths, radii of curvature greater than 100 mm can be produced only with very poor apex centering. When such a system is intended to provide homogenization of the beam by superpositioning of partial beams, poor apex centering will result in reduced homogeneity of the beam.

FIG. 3 shows an homogenizing optical system which comprises plano-convex cylindrical lenses 116a, 116b, 116c and plano-concave cylindrical lenses 118a, 118b, 118c. The direction of the incident laser light beam is indicated by arrow 118.

For such an arrangement the illumination aperture NA is as follows $$NA = \frac{(n-1) \cdot d_o}{2 \cdot f_{(124)}} \cdot \sqrt{2}$$

wherein n is the refractive index and $d_o$ as well as $f_{(124)}$ may be gathered from FIG. 3, i.e. $d_o$ is the object field size and $f_{(124)}$ the focal length of the convergent lens 124. The convergent lens either is convex at both sides or plano-convex.

FIG. 3 also shows the field size $D_o$ which results as follows:

$$D_o = \frac{f_{(124)}}{f_{ab}} \cdot d_o$$

In FIG. 3 $f_a$ designates the focal length of the plano-convex cylindrical lenses 116a, 116b, 116c; $f_b$ designates the focal length of the plano-concave lenses 118a, 118b, 118c; $f_{ab}$ designates the combined focal length of the systems composed of the plano-convex and plano-concave lenses; a designates the distance between the main planes of the plano-convex and plano-concave lenses. The imaging is effected on screen 126.

The combination shown of plano-convex and plano-concave cylindrical lenses provides a new focal length according to the following equation:

$$f_{ab} = f_a \cdot f_b (f_a + f_b - a).$$

Practically any focal length can be adjusted positively or negatively by adequate selection of the radii of the convex and concave curvatures (up to 100 mm) and the distance a between the base areas of the lenses.

The optical arrangement illustrated in FIG. 3 is suitable for producing illumination apertures smaller than 10 mrad and the incident laser beam is characterized by very good homegeneity. With such an arrangement especially an excimer laser can be used for efficient illumination of a diaphragm with the beam being very homogeneous and the illumination aperture very small. The lenses are combined in such a way that the energy densities resulting in the concave lenses 118a, 118b, 118c will not be too great, remaining below the destruction limit. In FIG. 3 also the main planes H₁ and H₂ of the lens system are identified. The positions of the object field and the image field result accordingly.

The three plano-convex and the three plano-concave cylindrical lenses shown in FIG. 3 may be substituted by more than three lenses, just as in the embodiment according to FIGS. 1a and 2.

Figure 4:
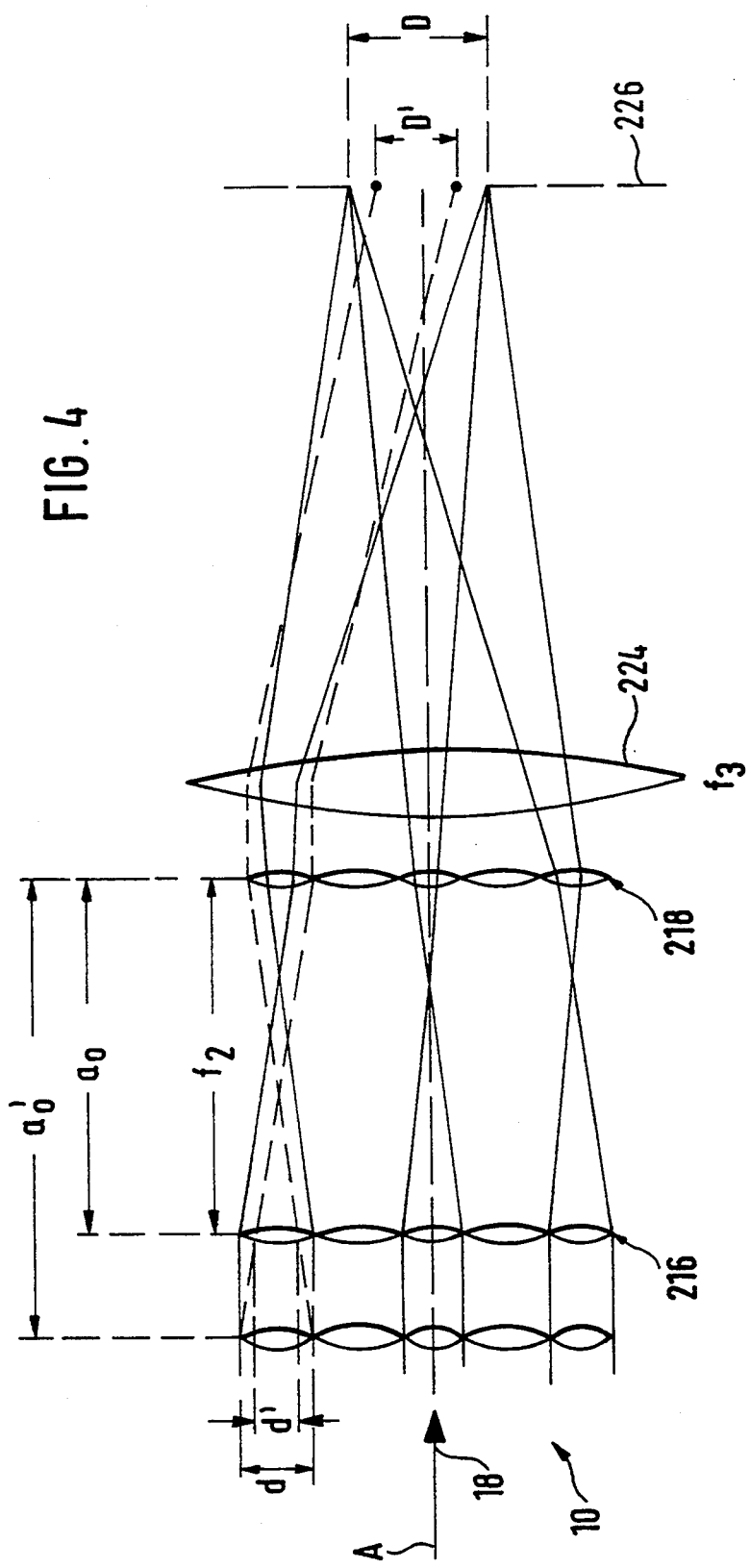
FIG. 4 illustrates a modified embodiment which includes an upstream illuminating lens array.

FIG. 4 illustrates a system which is modified as compared to the embodiments described in that it comprises an illumination lens array 216.

In this embodiment an additional lens array 216 is provided for optimum illumination of a cylindrical lens array 218. The illuminating cylindrical lenses 216 are spaced from the corresponding imaging cylindrical lenses 218 by a distance $a_o$ which is greater than or the same as the focal length $f_2$ of the individual lenses of the cylindrical lens array 218. FIG. 4 shows two positions of the lenses 216, one position is shown in dashed lines. The focal length $f_1$, of the individual lenses of the illuminating lens array preferably is selected between 0.5 $f_2$ and 0.8 $f_2$, with $f_2$ being the focal length of a lens in the lens array 218. As the focal length $f_1$ is chosen in the above mentioned range, the laser light beam 10 is incident in segments upon the associated imaging lenses of the imaging lens array 218. In FIG. 4 the object field size is designated d, respectively d'. If the distance $a_o$ which the illuminating lens array 216 has from the imaging lens array 218 equals the focal length $f_1$ of the individual lenses in the illuminating lens array 216, the object field size d equals the base width of the cylindrical lenses. If the distance is greater (cf. $a_o' > f_2$ as illustrated in FIG. 4 in dashed lines) the corresponding illuminated object field d' is smaller, in accordance with the beam convergence produced by the lenses. The focal length preferably is selected according to the formula:

$$f_1 = 0.7 f_2.$$

Such a design makes sure that the imaging lens array 218 (focal length $f_2$) will not be exposed to energy densities which are too high. As shown in FIG. 4, all the cylindrical lenses of the illuminating lens array 216 as well as the imaging lens array 218 have the same base width d.

The illuminating lens array 216 not only makes sure that any ray tilt of the illuminating laser beam 10 practically cannot cause any disturbance, it also warrants very stable illumination parameters which are largely independent of the properties of the laser beam. Specifically, the illuminating lens array 216 provides very good steepness of the edges of the illumination field produced (i.e. great sharpness at the transition from the illuminated field to the non-illuminated surrounding field), this being determined substantially only by the aberration of the imaging optical system (lens array 218 and imaging lenses 224). The imaged laser beam is projected onto plane 226 where its diameter is D, respectively D'. In the plane 226 the laser beam is homogenized.

What is claimed is:

1. A device for homogenizing a light beam (10), comprising an array of first lenses (16a, 16b, 16c) impinged upon by a light beam (10) from one side (20) wherein the light beam propagates from a source in a direction (18) parallel to the optical axis (A) of the device, each of the first lenses being convexly shaped on the side upon which the light beam impinges and being prismatically shaped on the side (22) from which the light beam emerges, the prismatic shape being such that a first part of the light beam impinging on each of said first lenses is deflected to one side of the optical axis (A) and a second part of the light beam impinging on each of said first lenses is deflected to another side of the optical axis (A), and at least one second lens (24) disposed downstream, with respect to the path of the light beam from the source, from the array of first lenses (16a, 16b, 16c), said at least one second lens being a convergent lens.

2. A device according to claim 1, wherein each of the first and second lenses are rod-shaped and have axes that are parallel.

3. A device according to claim 1, wherein the convex shape of each of the first lenses is cylindrical.

* * * * *